United States Patent
Worley

[19]

[11] Patent Number: 6,021,079
[45] Date of Patent: Feb. 1, 2000

[54] FAST, LOW COST METHOD OF DEVELOPING CODE FOR CONTACT PROGRAMMABLE ROMS

[75] Inventor: Eugene Robert Worley, Irvine, Calif.

[73] Assignee: Richard Mann; a part interest

[21] Appl. No.: 09/076,989

[22] Filed: May 13, 1998

[51] Int. Cl.[7] .................................................. G11C 7/00
[52] U.S. Cl. .................................. 365/225.7; 365/189.11
[58] Field of Search ........................... 365/225.7, 189.11, 365/230.06

[56] References Cited

U.S. PATENT DOCUMENTS

| | | | |
|---|---|---|---|
| 5,070,384 | 12/1991 | McCollum et al. ..................... | 257/530 |
| 5,130,777 | 7/1992 | Galbraith et al. ..................... | 365/225.7 |
| 5,233,206 | 8/1993 | Lee et al. ............................... | 365/225.7 |
| 5,242,851 | 9/1993 | Choi ....................................... | 438/215 |
| 5,282,158 | 1/1994 | Lee ......................................... | 365/149 |
| 5,391,518 | 2/1995 | Bhushan .................................. | 438/281 |

*Primary Examiner*—Trong Phan

[57] ABSTRACT

Methods are disclosed to make an anti-fuse PROM which can be embedded into a conventional CMOS process with few additional processing steps and a small additional area for the write circuitry. Nominal, low voltage transistors are used to program the PROM such that these transistor remain functional some time after programming for the purposes of verifying functionality of the memory's programming code. Once the program code has been verified a low cost production version of the part can be instantly made using standard ROM mask programming.

12 Claims, 7 Drawing Sheets

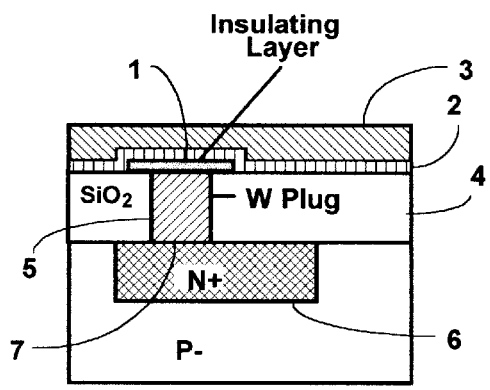
Fig. 1.
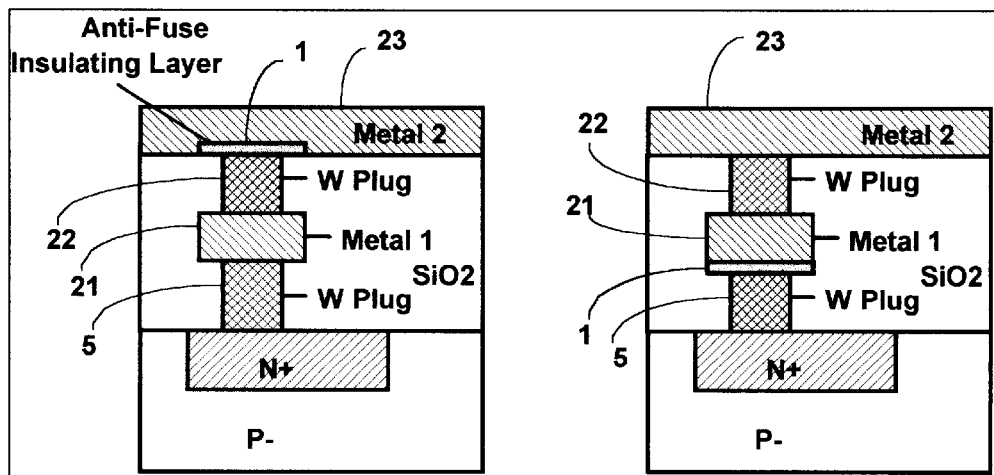
Fig. 2a  Fig. 2b
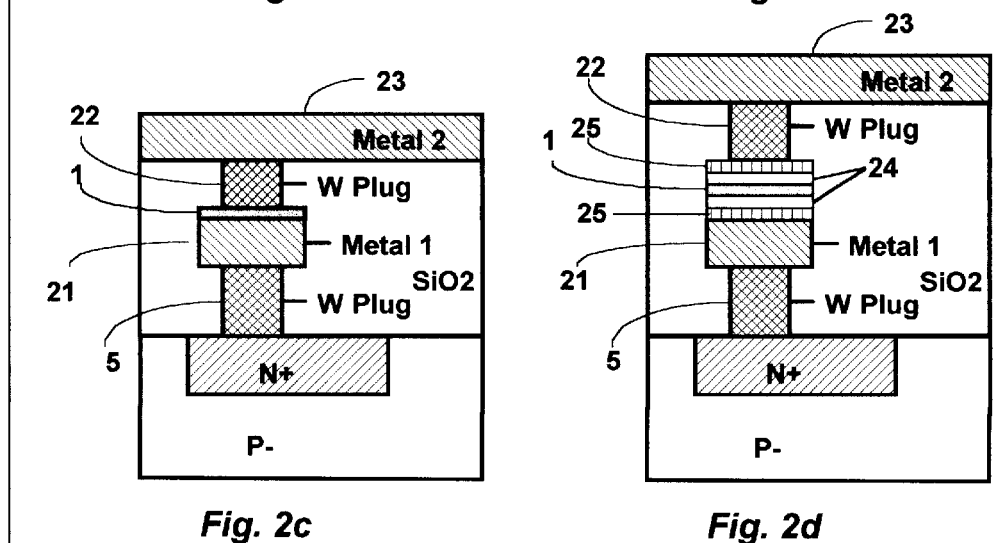
Fig. 2c  Fig. 2d

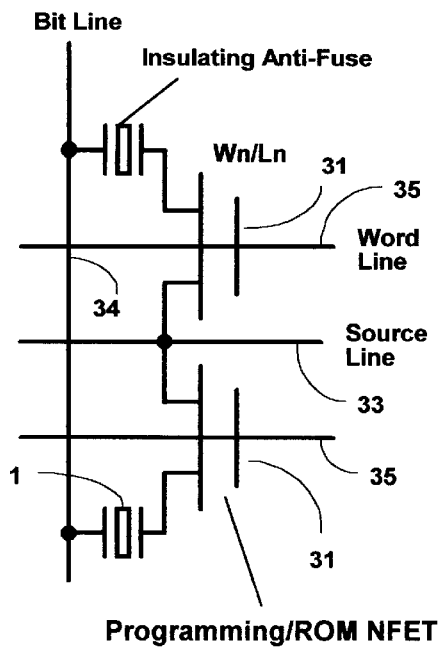
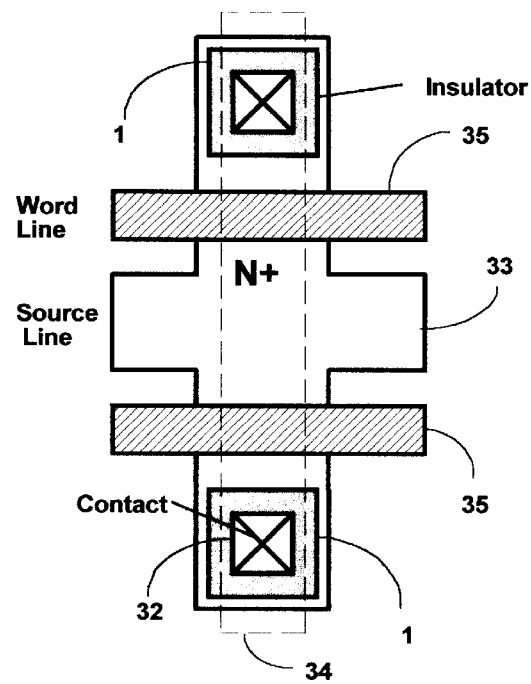
*Fig. 3a*   *Fig. 3b*
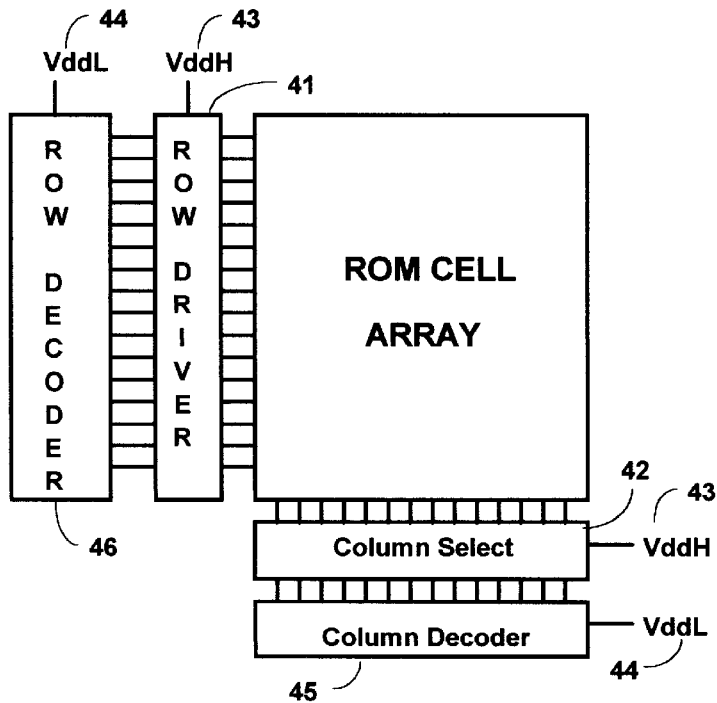
*Fig. 4*

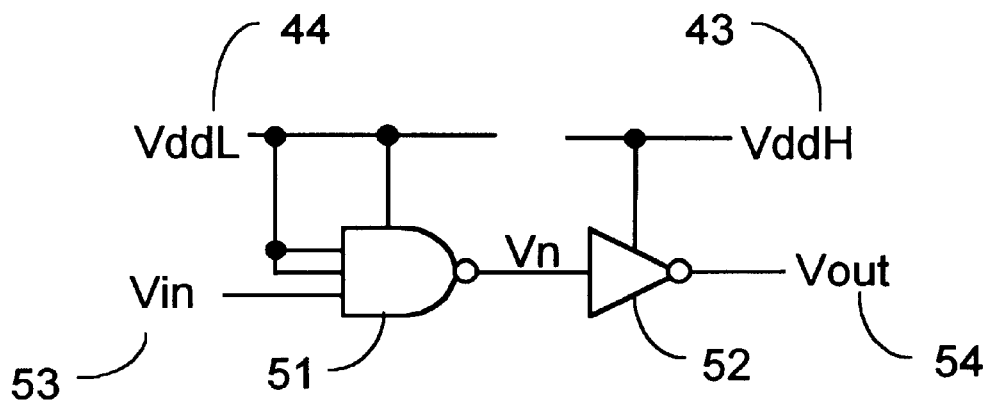
*Fig. 5a*
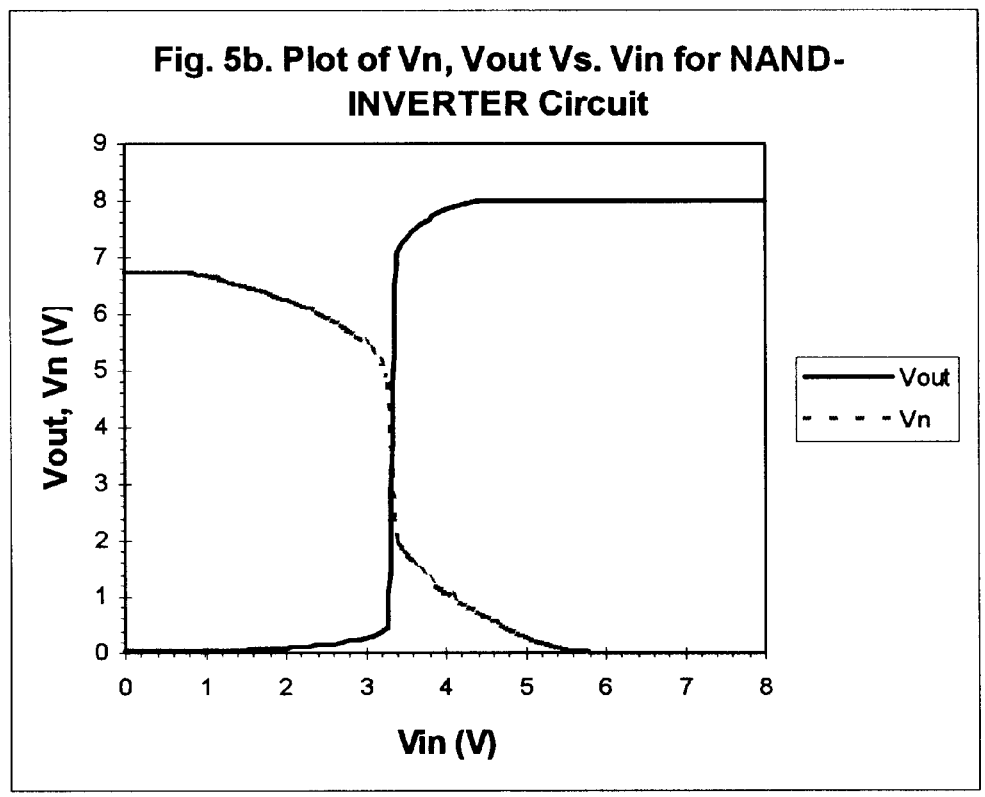

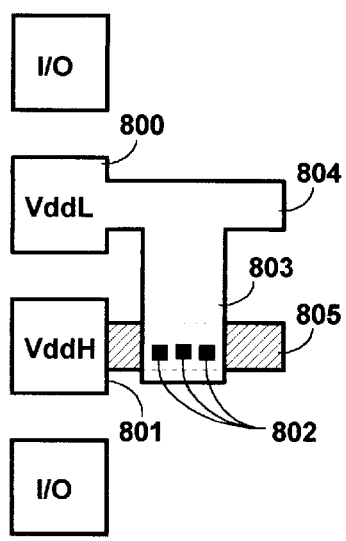
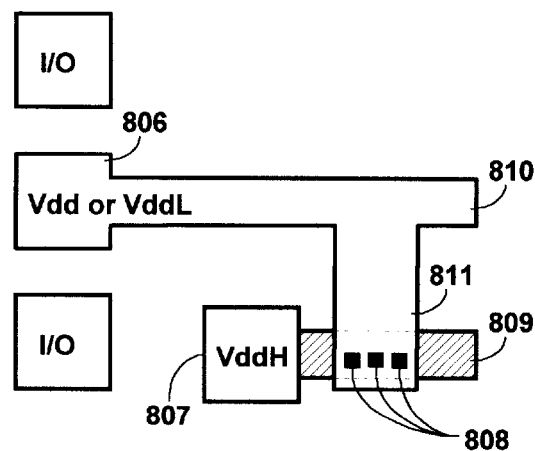
Fig. 8a.
Fig. 8b.

FAST, LOW COST METHOD OF DEVELOPING CODE FOR CONTACT PROGRAMMABLE ROMS

BACKGROUND OF THE INVENTION

1. Field of the Invention

This invention is directed to a one time programmable Read Only Memory (ROM) which is used for code development and can be implemented in a standard CMOS process with a limited number of additional processing steps. Anti-fuse technology is used as the programming element for the ROM.

2. Prior Art

The most cost effective, high volume production non-volatile memory used principally for program or instruction storage is the mask programmable Read Only Memory (ROM). The mask programmable ROM is dense, offers high access speed, and requires no special processing steps when used in standard MOS logic processes. However, it has two serious disadvantages. They are 1. High re-programming cost. Reprogramming requires generation of a mask and the processing of at least a few wafers for code verification. The re-programming cost can easily cost over $10,000.
2. Poor re-programming turn around time. As mentioned in 1, reprogramming requires generation of a mask and subsequent integrated circuit processing which can take a few weeks.

The high cost of re-programming a ROM and the poor turn around can result in high chip development cost and costly "time to market" delays. Given the program complexity of today's micro-controllers and DSPs, repeated changes to program code or software is common.

One solution has been to develop emulator chips. These chips remove the ROM and port the ROM addresses, control, and data I/O to chip pins for interface to an external Programmable Read Only Memory or PROM. This approach also has some short comings including 1. The need to make two versions of a chip. The amount of layout and design effort needed to make two versions is costly and consumes design resources.
2. Speed issues. External PROMs are inherently much slower than internal mask programmable ROM. Typically, an emulator chip cannot perform at speed.
3. Final package incompatibility. The "emulator" chip with its external PROM not only runs slower but is in a different package than the production ROM version of the part.

Another method used for code development is embedded flash memory. Unfortunately, adding flash ROM can triple the cost of a die. Furthermore, flash has slower access times than metal mask ROM and consumes more die area. Embedding flash memory into a CMOS process requires that a significant number of masking steps be added to the process. Furthermore, testing flash memory is slow and expensive. Thus, flash is not nearly as cost effective as mask ROM for applications having high part volumes and no need for field programming up-dates.

Yet another method that may be used for code development is based on fuse or anti-fuse technology. Because of a reduced current requirement for programmning the cell, anti-fuse technology has been preferred over fuse technology for MOS based memories. Anti-fuse technology uses an insulating element in the contact of an addressable cell which can be shorted by passing a relatively high voltage and current through the insulating element thereby causing a rupture or short and thus, a state change from an insulating element to a conductive element. Insulators include oxide ($SiO_2$), silicon nitride ($Si_3N_4$), various combinations of oxides and nitrides, polysilicon, and amorphous silicon. These types of memories are used in permanent applications requiring reliability and, therefore, need special high voltage transistors to program the cells. The addition of these special transistors to the process adds to its cost and are not required for reading the memory.

SUMMARY OF THE INSTANT INVENTION

A more cost effective solution than the approaches listed above is to have an electrically programmable development ROM which can be readily converted to a meal mask programmable ROM for production. The object of the present invention is to have a code development PROM with the following characteristics:

1. Simple process additions over existing logic CMOS process. Ideally, it is desired that only a few simple process additions be made to the CMOS logic process with as few new masking steps as possible. Furthermore, it is desired not to introduce high voltage transistors into the process if possible.
2. High read speed. The read speed of the PROM should be comparable to the read speed of the metal mask ROM.
3. Small additional write circuitry. The PROM should introduce a negligible amount of write circuitry which the mask version of the ROM does not require.
4. Instant conversion to mask ROM. Once the program code is stable and the part is ready for production then it is desired that the PROM be converted to mask ROM without any re-layout of the chip. Ideally, only the contact mask layer should be generated for the masked, production ROM.
5. The embedded PROM technology should be scaleable.

It is the object of the invention to have a memory which posses all of the characteristics listed above using an anti-fuse technology based on an amorphous silicon layer or an insulator layer such as deposited nitride which is placed in the contact of a ROM cell.

PRIOR ART STATEMENT

Kathryn Gordon and Richard Wong, "Conduction Filament of the Programmed Metal Electrode Amorphous Silicon Antifuse", IEDM 1993, pp. 27–30. The paper provides a description of the programming characteristics of the amorphous silicon anti-fuse.

"Anti-fuse Developments—a Pattern Emerges", Electronic Engineering, June, 1995, pp. 12–16. This article reviews various types of anti-fuses.

U.S. Pat. No. 5,282,158. Transistor Antifuse For a Programmable ROM. This patent describes drain type anti-fuse formed between the bit line and two N+ diffusions which constitute the drains of mirrored PROM MOS transistors.

U.S. Pat. No. 5,242,851. Programmable Interconnect Device and Method of Manufacturing Same. This patent describes a method of making an anti-fuse using polysilicon and describes a programmable ROM as an application.

U.S. Pat. No. 5,070,384. Electrically Programmable Anti-fuse Element Incorporating a Dielectric and Amorphous Silicon Interlayer. This patent describes construction of an anti-fuse which uses a composite of a dielectric material layer and an amorphous silicon layer. The electrode material is also described which is a refractory metal such as tungsten.

BRIEF DESCRIPTION OF THE DRAWINGS

FIG. 1 is a cross section of a contact with an anti-fuse insulator.

FIG. 2a is a cross section of an anti-fuse insulator located under metal 2 and on top of the second tungsten plug.

FIG. 2b is a cross section of an anti-fuse insulator located under first metal and on top of the first tungsten plug.

FIG. 2c is a cross section of an anti-fuse insulator located on top of first metal and on bottom of the second tungsten plug.

FIG. 2d is a cross section of an anti-fuse insulator similar to FIG. 2 but with an interface metal with a low melting temperature.

FIG. 3a is a schematic diagram of two mirrored PROM cells with anti-fuses present.

FIG. 3b is a layout diagram of two mirrored PROM cells with anti-fuses present.

FIG. 4 is a block diagram of the PROM of the present invention.

FIG. 5a is a diagram of conventional CMOS NAND decoder with a output inverter which can shift logic levels (two of the inputs of the NAND gate are tied to Vdd to illustrate level shifting properties of one of the inputs).

FIG. 5b is a plot of the NAND input voltage versus output voltage of the NAND gate and the output voltage of the level shifting inverter.

FIG. 8a is a layout diagram showing two power supply pads corresponding to two different power supply levels required for programming the memory array when anti-fuses are present. The two pads can be connected together for the metal mask version of the ROM.

FIG. 8b is a layout diagram of an interior high voltage pad for integrated circuits with one Vdd power pad.

DESCRIPTION OF THE PREFERRED EMBODIMENT

Figure 6A:
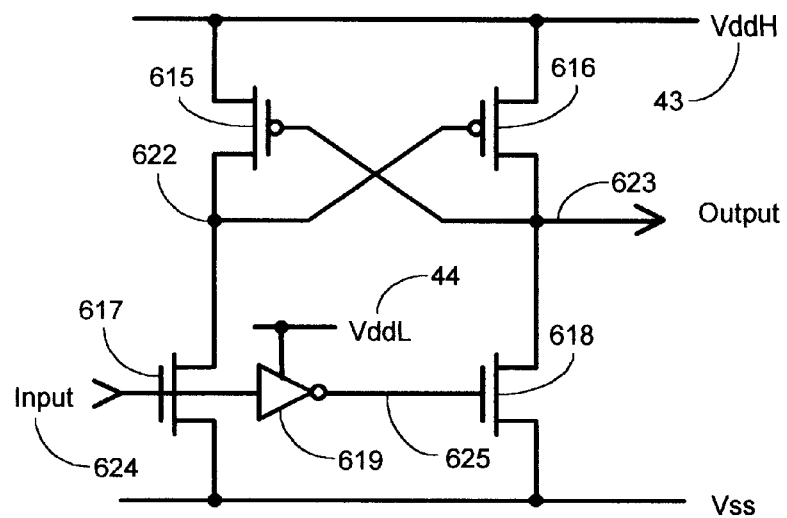
FIG. 6a is a prior art schematic diagram of a latch type logic level shifter.

One key to realizing the five desired characteristics mentioned earlier is to acknowledge that program code development or verification can be performed with a part that has substantially lower reliability and even lower yield than that of a production part. A requirement of a code development part is to have it work long enough to verify code which can be anywhere from minutes to days in most cases. Another requirement is to have enough good programmable parts to make the necessary code changes during the debugging phase. Also, it is known that transistors and hence, circuits, can work at voltages substantially above the maximum rated voltages. The maximum operating voltage of MOSFET integrated circuits is based on a reliability requirement of 10 years of operation at maximum temperature. Chips can be reliably operated at higher voltages for shorter periods of time and at lower temperatures if the longevity requirement is substantially reduced as in the case of a code development part. Thus, the desired characteristics mentioned earlier can be achieved by placing an anti-fuse insulator in a ROM contact and blowing or rupturing the insulator by elevating the ROM voltage to values above the normal operating value long enough to program the ROM. Scalability comes from the ability to reduce the thickness of the insulator as operating voltages are reduced.

Gate oxide thicknesses of MOSFETs are typically selected to be much larger than that needed by a "native" or defect free oxide to last 10 years at the maximum rated voltage. One example (Moazzami, 1988 IEDM, pp. 710–713) shows that at 125C a native gate oxide thickness of 80 Å will last 10 years at 5.5 V. In practice, however, reliability defects restrict the minimum oxide thickness in this case to about 130 Å. At this thickness a defect free oxide can last over 10 years at 10 V. Furthermore, it is known that the smaller the total gate oxide area the lower the probability of a reliability defect within this area. Thus, minimizing the amount of circuitry exposed to the high voltage required to program an anti-fuse will improve the reliability of the chip and allow it to last well beyond the time typically needed to verify the code.

FIG. 1 shows a diagram of an anti-fuise. As mentioned earlier, the anti-fuse insulator 1 can either be a layer of amorphous silicon which is insulating or a deposited insulating layer which is placed between first metal 3 and the tungsten (W) plug 5. A thin barrier metal layer 2 such as titanium nitride is shown which is used to "glue" the main conductor 3 which is typically aluminum to the tungsten plug 5 in circuits outside the PROM array. The anti-fuse insulator 1 prevents conduction between the bit line 3 and the N+ or drain diffuision 6. If a large enough voltage is presented between the bit line 3 and the N+ diffusion 6 the anti-fuse insulator 1 will rupture forming a conductive melt filament. In the case of an amorphous silicon insulator the melt filament is a silicide. For other insulators such as silicon nitride or $SiO_2$ the melt filament is metal.

It should be noted that the insulating film can also be placed at the N+/plug interface 7. However, because of the high thermal conductivity of silicon, it is less desirable to place the anti-fuse insulator there. An anti-fuse insulator in contact with a material of high thermal conductivity requires a higher amount of electrical energy to create a melt filament.

The process sequence for the anti-fuse begins after Chemical/Mechanical Polishing or CMP. An insulating film is deposited over the tungsten plugs and oxide which is level with the plugs. Next, a masking step is used to remove the insulator film in all areas except where the tungsten plugs connect to the drain of the ROM cell. Next, metal is deposited over the wafer and patterned with an insulating film existing between the Drain plug of the ROM transistor and the first metal layer which forms the bit line. To convert the "PROM" to a contact mask programmable ROM the insulating film step is omitted and the contact mask modified to implement a programming code. It should be noted that anti-fuses can also be incorporated into ROMs fabricated without CMP such as that described in U.S. Pat. No. 5,391,518.

FIG. 2 shows some other ways of placing the insulating anti-fuse film in a CMP process in which it is possible to stack vias on top of a contact and each other. Note that for simplicity, the thin barrier metal 2 of FIG. 1 is not shown but is assumed to exist where it is necessary for the adhesion of aluminum to tungsten. FIG. 2a places the insulating film on top of the $2^{nd}$ Metal via plug 22. In this case it is assumed that $2^{nd}$ Metal 23 forms the interconnect or, in the case of a ROM, the bit line. In FIG. 2b the insulator is located on the lower surface of 1$^{st}$ Metal 5 and on top of the contact tungsten plug 5. In FIG. 2c the anti-fuse insulator is located on top of 1$^{st}$ Metal 21 and on the bottom of the via plug 22. Thus, if more metal layers are stacked then more possible placements of the insulating anti-fuse are possible. Thus, the placement concept shown in FIG. 2 can be extended to any number of metal/via layers.

FIG. 2d shows an anti-fuse similar to FIG. 2c except that a thin interface metal 24 with a low melting temperature has been placed on either side of the anti-fuse insulator 1. The purpose of these two electrode boundary layers 24 is to reduce the energy required to form a conductive melt filament through the ruptured insulator. Aluminumn, for example, has a melting temperature of 660° C. which will make a better anti-fuse electrode metal than tungsten which has a melting temperature of 3,422° C. Other metals with low melting temperatures include indium (157° C.) and tin (232° C.). Another consideration is that this metal have a high boiling point so that the metal does not vaporize. Aluminum has a boiling temperature of 2520° C., indium 2073° C., and tin 2603° C. Other considerations for the electrode material include the heat capacity which should be as small possible and the thermal diffusivity which should also be as small as possible. A barrier metal 25 may be required for adhesion between the anti-fuse electrode metal 24 and other normal integrated circuit metals such the tungsten plugs 22 or aluminum interconnect 21. The thickness of the interface metal should be at least several times the thickness of insulator so that a melt filament can penetrate the insulator without having any significant effect on the consistency of the interface metal layer. Further encapsulation may be required since a metal with a low melting point may melt during subsequent back end processing.

FIG. 3a shows a schematic diagram of two anti-fuse ROM cells and FIG. 3b shows the corresponding layout of the two cells which are the mirror image of each other. The source line 33 which is an N+ diffusion or implant is shared between the two cells. This ROM cell layout is typical of contact programmable ROMs. For the case of an amorphous silicon anti-fuse insulator the resistance of this layer located in the drain contact 32 can go from 1000 Mega-Ohms in the initial state to several hundred Ohms or even 10's of Ohms in the programmed state depending on the strength of the programming pulse. The anti-fuse insulator 1 can be ruptured or "programmed" by simultaneously applying a voltage to the word line 35 or gate and the bit line 34 or drain of the target cell or transistor. Applying a gate voltage without the drain voltage will cause no drain current to flow. Also, placing a drain voltage without gate voltage will, likewise, cause no drain current to flow since the MOSFET is in the off state. Reading the cell can be done reliably by applying a drain voltage of no more than the rupture voltage divided by a factor of about 2.5.

An example of a practical implementation will now be presented. For a ROM cell in a 0.5 $\mu$m, 5 V process the cell can be operated momentarily to voltages as high as 8 V. At this voltage a ROM cell can be expected to sink nearly 1 mA. In a paper by Chenming Hu (IEDM, 1992, pp 24.1.1–24.1.4) it is shown that for metal electrodes and an amorphous silicon anti-fuse a rupture resistance of less than 1000 $\Omega$ can be achieved for a 1 mA pulse. Specifically, extrapolating the "metal electrode" linear curve of FIG. 6 of the reference to 1 mA produces an "ON" resistance of 780$\Omega$. FIG. 8 of said reference shows that a rupture voltage of 8 Volts can be achieved with an amorphous silicon film thickness of approximately 900 Å or a silicon nitride thickness of approximately 120 Å. The maximum drain or bit line read voltage is 8/2.5 or 3.2 V. For a 3.3 V part the programming voltages can momentarily go to about 5 V. For a rupture voltage of 5 V the layer thickness for amorphous silicon is about 600 Å and for silicon nitride 75 Å. The maximum read voltage for this case is then 5/2.5 or 2 V. This read voltage is above that used in stacked gate flash cells which use maximum bit line read voltages of about 1.2 V because of unwanted hot electron programming effects.

To reduce the over voltage stress on the circuits during programming two power supply voltages can be introduced. FIG. 4 shows a block diagram of a ROM in which two power supply voltages, VddH 43 and VddL 44, have been inserted. One of the properties of CMOS logic is that one logic gate operating at a certain supply can successfully drive another logic gate operating at slightly higher voltage. For example, a NAND gate operating at 6.75 V can drive an inverter powered at 8 V such that the inverter's output is essentially at full logic levels, i.e. 0 and +8 V. This property thus allows only a small portion of a CMOS logic chip to see the high voltage which is required for programming the anti-fuse PROM. As seen in FIG. 4 the high programming voltage, VddH, is applied to the column select 42 and row drivers 41 while the lower voltage, VddL, is applied to all other logic circuits such as the row decoder 46, the column decoder 45, and the rest of the chip system logic.

FIG. 5a shows the schematic of the example circuit mentioned above in which a NAND gate 51 which is used as a row decoder connects to an inverter 52 which is used as a word line driver. Note that the NAND gate 51 is connected to the low voltage supply, VddL 44, and the inverter 52 to the high voltage supply, VddH 43. FIG. 5b shows a plot of the DC transfer curve between the NAND gate input 53 and the inverter output 54. As the plot shows the output switches to a full CMOS level in spite of the modest level up shift which is 8–6.75 v or 1.25 V.

Figure 6B:
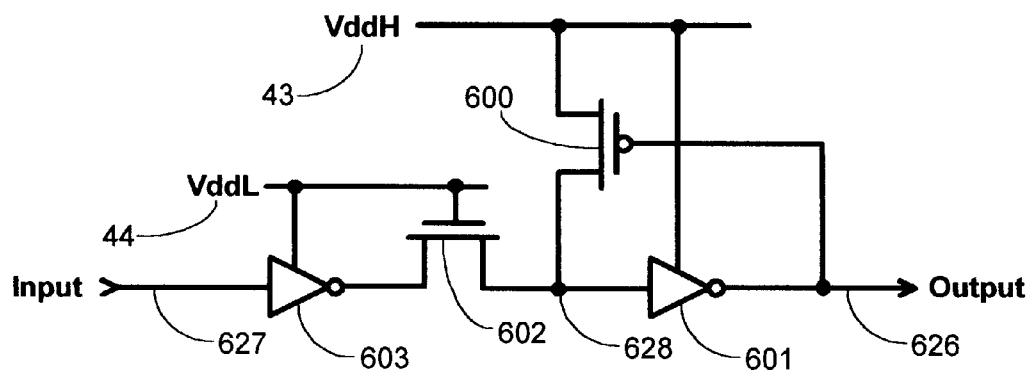
FIG. 6b is a prior art schematic diagram of a common gate type of logic level shifter.

Of course, circuits specifically designed for level up shifting can also be used. FIG. 6a shows a diagram of latch type level up shifter and FIG. 6b shows a diagram of a common gate type level up shifter. These circuits can also be used in the normal read mode where there is no level shifting required. The penalty in using these types of circuits is reduced propagation delay under a normal read or non-shift condition and added layout space. The advantage is that the lower voltage level, or VddL, can be the normal operating voltage since these types of shifters can work with larger differences between VddH and VddL.

In FIG. 6a two cross coupled PFETs 615 and 616 form the level shifting latch with their sources tied to the high supply voltage, VddH 43. Two NFETs 617 and 618 are ratioed against the cross coupled PFETs 615 and 616 such that 617 or 618 can, one at time, pull the latch nodes 622 or 623 near ground and cause a state change in the latch. Controlling the NFETs 617 and 618 is the input node 624 which has logic levels at either 0 or VddL 44. Note that the compliment of the input 624 is presented to gate node 625 of the second NFET 618 via an inverter 619 connected to the low supply voltage, VddL 44. Although latch note 623 is shown as the output, either latch node can be used as an output with node 623 being non-inverted from the input 624 and node 622 being inverted. In this design transistors 615, 616, 617 and 618 will see the high voltage, VddH 43. Thus, the logic levels of 0 and VddL 44 appearing at input 624 are translated to 0 and VddH 43 at node 623, respectively.

In FIG. 6b a level shifter is made using a common gate NFET 602 which acts as an isolation device when the voltage on node 628 goes to the value of VddH 43 via PFET 600. The input signal is applied to node 627 and is inverted and buffered by inverter 603 which is powered by VddL 44. NFET 602 and the NFET associated with inverter 603 are strong enough to pull node 628 close to ground when the input 627 is at VddL 44 even though the pull up PFET 600 is in the "on" state. Also, the NFET and PFET of inverter 601 are ratioed so that inverter 601 outputs a logic 0 when its input voltage on node 628 reaches VddL−Vt which occurs when the level of input 627 is at or near ground potential. Vt is the threshold voltage of NFET 602. Note that when pulling up node 628 NFET 602 is operating in the source follower node which therefore causes the Vt drop from VddL 44. When node 628 goes to VddL−Vt node 626 goes to near ground potential and causes PFET 600 to turn on and pull node 628 all the way to VddH 43. When this happens, the source of NFET 602, i.e. node 628, becomes higher in potential than that of its gate and, therefore, causes NFET 602 to go to the non-conducting or "off" state. In this design, transistors 600, 602, and those of inverter 601 will see the high voltage of VddH 43. Thus, the logic levels of 0 and VddL 44 appearing at 627 are translated to 0 and VddH 43 at output node 626, respectively.

Figure 6C:
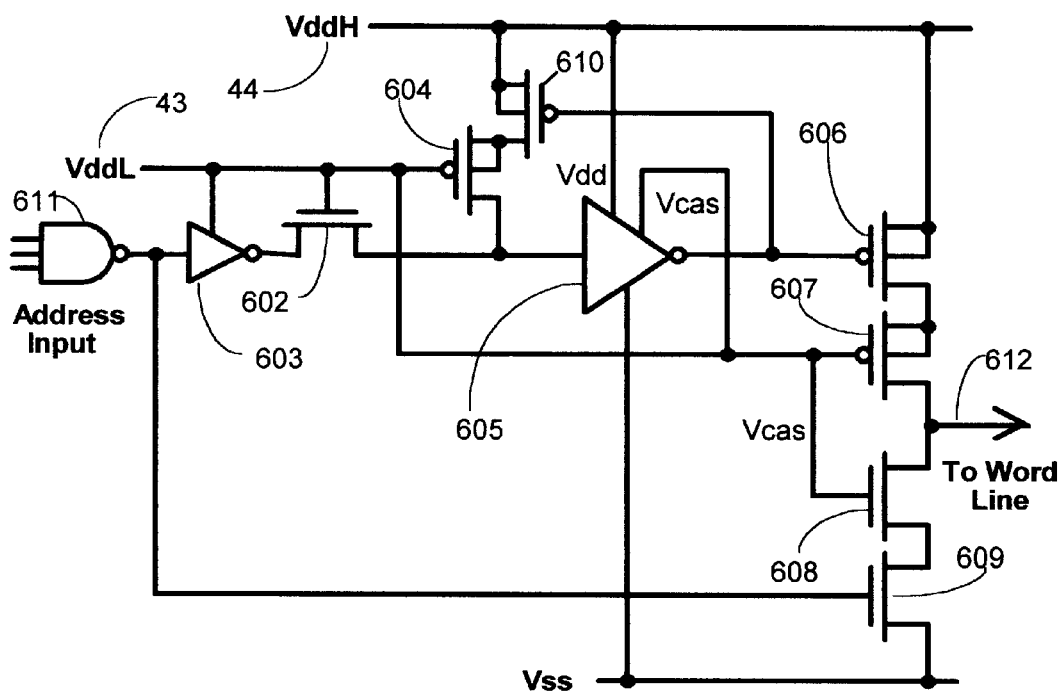
FIG. 6c shows an example of a row decoder using a common gate level shifter with cascode transistors in the high voltage circuit.

FIG. 6c shows an example of a row decoder which uses level shifting cascode circuitry. The level shifter is a cascoded version of that of FIG. 6b. Cascoded high voltage circuitry such as that shown in FIG. 6c allows circuits to operate reliabily up to twice that of the maximum rated voltage of the transistors. This is accomplished by splitting the voltage between two series transistors such as 608 and 609 so that each transistor is subjected to half of the voltage across its gate, drain, and source electrodes. One parameter that may limit the maximum voltage is the so called gated diode breakdown of the NFET 608. This is the breakdown voltage between the drain of 608 and its body or substrate which is at Vss. Since the body or well of the PFETs can be tied to their respective sources as shown by PFET 607 the voltage applied between the drain and body or well of the PFETs is split and, therefore, does not typically set the maximum operating voltage of the circuit.

In FIG. 6c transistors 606, 607, 608, and 609 form a cascoded high voltage inverter. The voltage applied to polysilicon gates of the cascode pass transistors is the VddH 44 is the high voltage that is applied to the ROM word line 612 when in the high logic state. Inverter 605 is also a cascoded inverter similar to that comprising 606, 607, 608, and 609. Transistors 610 and 604 represent a cascoded version of the pull-up transistor 600 of FIG. 6c. Transistor 602 and the pull down NFET of inverter 603 constitute a cascoded series pair of transistors. NAND gate 611 and inverter 603 are standard, non cascoded low voltage logic gates.

Note that in the conversion from the anti-fuse PROM to a metal mask ROM the cascode transistors can be converted to diffusion shorts by omitting the poly silicon gate. This is done to boost speed since the series transistors associated with cascodes are not necessary for strictly low voltage or VddL operation when the chip is converted to the metal mask version. For example, transistors 608 and 607 of FIG. 6c can be shorted out by omitting their respective polysilicon gates from the layout thus shorting the drain to the source. Therefore, transistor 609 becomes the only pull down transistor for the Word Line 612 and transistor 606 becomes the only pull up transistor. Also, for the metal mask ROM version the drain and source of transistor 602 can be shorted together and the pull-up transistors 610 and 604 can be disconnected by omitting the drain contact of 604. Correspondingly, for the metal mask ROM version transistor 602 of FIG. 6b can be shorted and transistor 600 opened.

Figure 7:
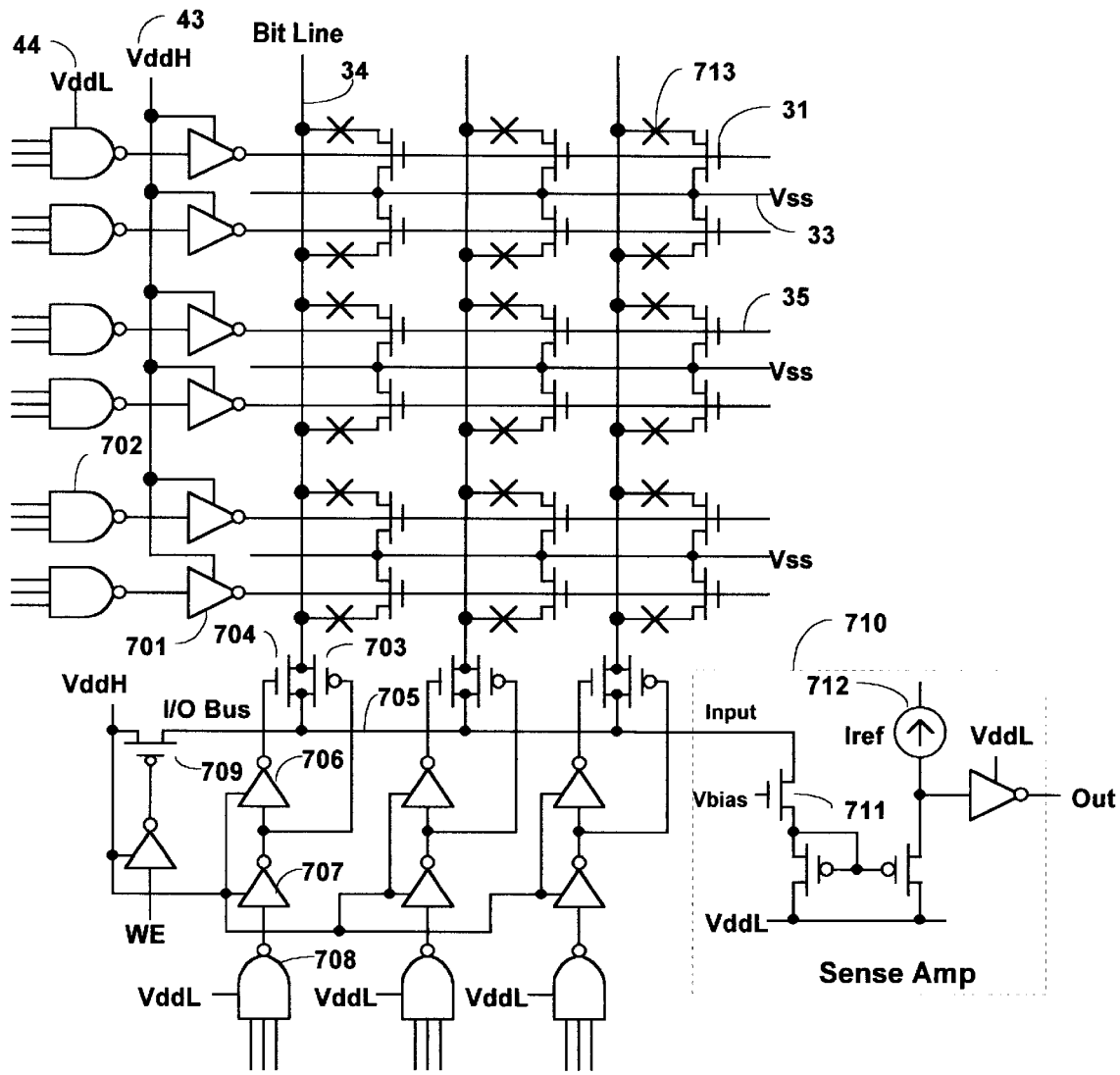
FIG. 7 is a logic diagram of an anti-fuse programmable ROM with two power supply levels.

FIG. 7 shows an example of a more detailed diagram of the proposed code development PROM. The "X" 713 represents the anti-fuse. The PROM array transistors 31 have their source lines 33 tied to Vss or ground. The word lines 35 are driven by inverters 701 which act as level shifters during programming. Row decoding is performed with NAND gates 702.

The bit lines 34 are connected to a full CMOS transmission gate comprised of a PFET 703 and an NFET 704. The PFET 703 is key in applying VddH to the bit line 34 during programming and is a relatively large device while the NFET 704 becomes more important during reading. The bit line transmission gates or multiplex gates tie to an I/O line 705 and are driven by such inverters as 706 and 707 whose control signal is derived from column decoding NAND gates such as 708. Note that inverter 707 also performs a level up shift function from the output of the NAND gate 708. A PFET 709 is used to drive the I/O line 705 to VddH during programming and is a relatively large device. Not shown is an NFET switch which guarantees that the I/O line 705 and selected bit are discharged after programming.

At the end of the I/O bus 705 is the sense amp 710. The sense amp is a current mirror type with a cascode transistor 711 which is used to set the bit line voltage during reading. The maximum bit line voltage during read is given by Vbias−Vtn where Vtn is the threshold voltage of NFET 711. Iref 712 is the sense amplifier's reference current which is typically set to one half of the cell current.

To program a cell or rupture its anti-fuse insulator 1 of anti-fuse 713 the word line is first driven to VddH 43 by one of the row inverters 701. Note that the row NAND decoders 702 and other circuitry is powered by VddL 44 to improve reliability and minimize internal latch-up. Confining the highest voltages to a relatively small amount of circuitry allows the designer to the focus on making this circuitry more robust to high voltages such as solid well ties and substrate ties. To avoid "Snap-Back" of the PROM cell NFET the voltage of the selected word line should first be raised first to VddH 43 followed by raising the voltage on the selected bit line to VddH 43. Only the cell with both word line and bit line voltages present will have its anti-fuse insulator blown.

After programming the appropriate anti-fuses in the PROM array the array is read for verification of the programming code. If a given PROM array does not successfully program then the part is thrown away and a new part is programmed.

Programming time for an anti-fuse cell is typically no more than 10 ms. If an array block size of 128 K-bits is assumed and a word size of 16 bits or cells, then at 10 ms/word the programming time is about 82 seconds. This contrasts with the weeks required to reprogram a masked ROM.

Since most modern integrated circuits have multiple power supply pins then it is possible to divide up power pins for the PROM development version of the part. FIG. 8a shows an example of a case were there are normally two Vdd pads, 800 and 801. Although the Vdd pads 800 and 801 are shown next to each other they may in fact be separated and are shown together only for convenience. For the development chip with a PROM one of the two Vdd pins is used for VddL 800 and the other for VddH 801. VddL line 804 provides the low voltage for the write control circuitry and the decoders while the VddH line 805 provides the high voltage applied to the word line and bit line of the PROM via the level shifters. For the production version with mask ROM the two supplies are connected together by the addition of contacts or vias 802 using the strap link 803. The contacts or vias 802 can be on the same layer as the programming contact or via so that only one mask change is required to go from the PROM version to the mask ROM version.

FIG. 8b shows a case were there is only one Vdd pad 806. In this case a second bondable pad 807 is provided behind the pad ring. The "Vdd" pad 806 is then used as the VddL pad for programming the PROM and the interior pad 807 as the VddH pad. As before, the VddL line 810 provides the low voltage for the write control circuitry and the decoders while the VddH line 809 provides the high voltage applied to the word line and bit line of the PROM via the level shifters. For the ROM production version of the part both power buses are hooked together either by contacts or, in the case of FIG. 8b, by vias 808 which are of the same layer as that used for the programming the ROM. The interior pad 807 is not bonded out in the production version. The strap conductor 811 in this case is an upper level of metal. The disadvantage of this approach is that the PROM package has to accommodate the extra pad that won't be used in the masked ROM version.

The programming of the PROM can be accomplished in one of two ways. One is to work through the microprocessor or microcontroller. The other approach is to double up the function of some of the pads so that the PROM can be accessed directly thereby bypassing the microcontroller. It is a common test practice, for example, to directly read a mask programmable ROM and bypass the microprocessor which normally controls access to the ROM. This is done by placing the appropriate operational code into the microprocessor. Once this is done to some of the microprocessor pins, such as data I/O pins, external RAM address pins, etc. can be changed to direct ROM access pins such as the ROM data pins, address pins, etc. The advantage of this approach is to simplify programming and to allow commercial programmers such as those made by BP Microsystems to program the PROM.

What is claimed is:

1. A PROM memory integrated circuit system comprising
a plurality of ROM cell MOSFET transistors which are arrayed,
a plurality of source lines connected to the sources of said plurality of ROM cell transistors,
a plurality of word lines connected to the gates of said plurality of ROM cell transistors,
a plurality of bit lines placed perpendicular to said plurality of word lines,
anti-fuse insulators placed between the drains of the plurality of said ROM cell transistors and the plurality of said bit lines,
a plurality of row decoder drivers whose output is connected to the plurality of said word lines,
a plurality of row decoders whose outputs connect to the inputs of said plurality of row decoder drivers,
a plurality of column select devices whose output connect to the plurality of said bit lines,
an Input/Output line connecting to the inputs of said plurality of column select devices,
a plurality of column decoders whose outputs control the plurality of said column select devices,
a write driver connected to said Input/Output line, and
a read sense amplifier connected to said Input/Output line.

2. The memory system of claim 1 in which the high voltage supplied to said PROM cell is kept within time-voltage limits so that nominal low voltage transistors can be used to apply the high programmning voltages to said cell while maintaining reliable read operations after programming at the normal operating voltage.

3. The memory system of claim 1 which is reliably read over long periods of time without unintentional programming by keeping the bit line voltage during reading to a value well below the programming bit line voltage or the voltage needed to rupture the anti-fuse insulator.

4. The memory system of claim 1 in which the insulator is removed and a contact or via programming mask with a ROM program code is substituted for low cost production purposes and whose code was developed using the PROM version of said chip.

5. The memory system of claim 1 in which the exposure of circuits to high voltage is minimized by using logic level shifting means at the immediate interface to the PROM cell array.

6. The logic level shift means of claim 5 in which level shifting is performed by conventional CMOS logic gates wherein gates directly interfacing to the PROM array are powered by a programnming voltage supply and all other gates are powered with a supply which has a lower operating voltage.

7. The logic level shift means of claim 5 in which a conventional level shift circuit such as a latch is used.

8. The logic shifting means of claim 5 in which cascode transistors are used to improve reliability and high voltage performance.

9. The logic shifting circuit of claim 8 in which cascode transistors are shorted or removed in the metal mask ROM version in order to improve speed performance.

10. The memory system of claim 1 having a separate pad means for the programmning voltage and a separate pad means for the lower operating voltage of the circuits which do not directly interface to the array and having both pad means with separate interconnect lines such that the mask programming layer of either contacts or vias can be used to connect both pad means together for the mask ROM version.

11. The pad means of claim 10 in which two or more pads that are normally used for the Vdd power of the circuit containing the PROM wherein one pad is used to supply the programming voltage and the others are used to supply the lower operating voltage.

12. The pad means of claim 10 in which there is only on Vdd power pad of said chip and in which a second pad of said chip is introduced at a convenient location which is used as the pad for bringing in the high programming voltage and which is not bonded out for the mask ROM version of the chip but is connected to the Vdd bus via the aforementioned mask programming layer of the mask ROM version of said chip.

* * * * *